United States Patent [19]

Van Damme et al.

[11] Patent Number: 5,624,785
[45] Date of Patent: Apr. 29, 1997

[54] IMAGING ELEMENT COMPRISING A PHOTOACID-SENSITIVE COMPOSITION AND A METHOD FOR PRODUCING LITHOGRAPHIC PLATES THEREWITH

[75] Inventors: Marc Van Damme, Heverlee; Joan Vermeersch, Deinze, both of Belgium

[73] Assignee: AGFA-Gevaert, N.V., Mortsel, Belgium

[21] Appl. No.: 628,899

[22] Filed: Apr. 9, 1996

[30] Foreign Application Priority Data

Apr. 21, 1995 [EP] European Pat. Off. .............. 95201017

[51] Int. Cl.$^6$ .................................. G03F 7/34; G03F 7/11
[52] U.S. Cl. .................... 430/253; 430/273.1; 430/302; 430/914
[58] Field of Search .................................. 430/253, 914, 430/273.1, 302

[56] References Cited

U.S. PATENT DOCUMENTS

| | | | |
|---|---|---|---|
| 4,175,964 | 11/1979 | Uchida et al. | 430/253 |
| 4,396,700 | 8/1983 | Kitajima et al. | 430/253 |
| 5,002,856 | 3/1991 | Anderson | 430/914 |
| 5,164,278 | 11/1992 | Brunsvold et al. | 430/914 |
| 5,462,833 | 10/1995 | Havguier et al. | 430/204 |

*Primary Examiner*—Richard L. Schilling
*Attorney, Agent, or Firm*—Breiner & Breiner

[57] ABSTRACT

The present invention provides an imaging element comprising contiguous to a hydrophilic surface of a support a hydrophobic photosensitive composition comprising a photosensitive acid precursor, an acid-sensitive composition which is capable of undergoing polymerization or crosslinking and a hydrophobic binder characterized in that said imaging element comprises one or more protective layers, at least one of the protective layers being contiguous to the hydrophobic photosensitive composition and being a transfer layer which is capable of adhering to a receptor element.

11 Claims, No Drawings

IMAGING ELEMENT COMPRISING A PHOTOACID-SENSITIVE COMPOSITION AND A METHOD FOR PRODUCING LITHOGRAPHIC PLATES THEREWITH

DESCRIPTION

1. Field of the Invention

The present invention relates to an imaging element comprising a layer comprising a photosensitive acid precursor and an acid-sensitive composition and to a method for the formation of lithographic printing plates therewith.

2. Background of the Invention

The use of imaging elements comprising a layer comprising a photosensitive acid precursor and an acid-sensitive composition for the production of images by information-wise exposure thereof to actinic radiation is well known. Almost all these materials are based on the principle of introducing a differentiation in solubility between the exposed and non-exposed parts of the acid-sensitive composition. The thus produced difference in solubility may be subsequently employed in a developing step to produce a visible image.

A difference in solubility between the exposed and non-exposed parts of the acid-sensitive composition is often used for the production of lithographic printing plates where a hydrophilic base is coated with the layer with the acid-sensitive composition, subsequently exposed and developed using a solvent, in general an aqueous solution to remove pattern-wise the acid-sensitive composition. When the photogenerated acid act as a catalyst for a reaction yielding substances which lower the solubility of the acid-sensitive composition in the solvent used, only the non-exposed or insufficiently exposed areas of the imaging element are removed during the development and the process is negative working. Such a process is for example described in EP-A 571330, 621508, 621509 and 634696.

The development of such imaging elements comprising a layer comprising a photosensitive acid precursor and an acid-sensitive composition and based on the principle of introducing a differentiation in solubility between the exposed and non-exposed parts of the acid-sensitive composition requires the use of a—preferentially aqueous—developer. This is a cumbersome and inherently dangerous operation for the user of said imaging elements due to the possible contact with said hazardous aqueous developer.

Moreover, the developed imaged elements need a further rinsing after the development step so that a sizeable amount of unwanted diluted aqueous waste is produced during the processing of said imaging elements, being an ecological and economical disadvantage for said process.

SUMMARY OF THE INVENTION

It is an object of the present invention to provide an imaging element comprising a hydrophobic photosensitive composition comprising a photosensitive acid precursor and an acid-sensitive composition being developable after exposure by using heat and/or pressure.

It is a further object of the present invention to provide a method for obtaining a lithographic printing plate of a high quality using said imaging element by a dry-developing step.

It is still another object of the present invention to provide a method for obtaining a lithographic printing plate using said imaging element in a convenient way, offering economical and ecological advantages.

Further objects of the present invention will become clear from the description hereinafter.

According to the present invention there is provided an imaging element comprising contiguous to a hydrophilic surface of a support a hydrophobic photosensitive composition comprising a photosensitive acid precursor, an acid-sensitive composition which is capable of undergoing polymerization or cross-linking and a hydrophobic binder characterized in that said imaging element comprises one or more protective layers, at least one of the protective layers being contiguous to the hydrophobic photosensitive composition and being a transfer layer which is capable of adhering to a receptor element.

According to the present invention there is also provided a method for obtaining a lithographic printing plate comprising the steps of:

(a) image-wise or information-wise exposing an imaging element according to the present invention (b) developing said exposed imaging element, characterized in that said development comprises in the order given the steps of:

(i) laminating before or after said exposure an uppermost layer of said imaging element to a receptor layer, which one is capable of adhering to said uppermost layer and (ii) peeling away the receptor layer from the hydrophilic surface of the support thus transferring said hydrophobic photosensitive composition patternwise to the receptor layer.

DETAILED DESCRIPTION OF THE INVENTION

It has been found that lithographic printing plates can be obtained according to the method of the present invention using an imaging element comprising contiguous to a hydrophilic surface of a support a hydrophobic photosensitive composition comprising a photosensitive acid precursor, an acid-sensitive composition which is capable of undergoing polymerization or cross-linking and a hydrophobic binder characterized in that said imaging element comprises one or more protective layers, at least one of the protective layers being contiguous to the hydrophobic photosensitive composition and being a transfer layer which is capable of adhering to a receptor element. More precisely it has been found that said printing plates are of high quality and are provided in a convenient way, thereby offering economical and ecological advantages.

The transfer layer according to the invention is a thermo-adhesive layer or a pressure-adhesive layer, which is capable of adhering to the underlying contiguous hydrophobic photosensitive composition and to a receptor layer.

Suitable thermo-adhesive layers (TALs) for use in the present invention have a glas transition temperature $T_g$ between 10° C. and 100° C. as measured with a 1090 THERMOANALYZER of Du Pont Co. During the lamination and delamination step a minimal thermal load should be imposed to the material in order to save energy and diminish the risk for material change or deformation. For these reasons the $T_g$ of the TAL is preferably below 60° C. The $T_g$ value of the TAL can be determined by the $T_g$ value of the polymer(s) used and/or by the addition of polymeric or low-molecular plasticizers or thermosolvents.

The adherance of the TAL to the receptor layer is also determined by the flow properties of the TAL while heating above the $T_g$. A parameter for describing this property is the melt viscosity. A TAL for use in accordance with the present invention has a melt viscosity of more than 3000 Poise measured at 120° C. with a VISCOELASTIC MELT TESTER of Rheometrics Co, Surrey, UK.

In order to induce easy film formation without unwanted sticking of the TAL to the backside of the imaging medium or to other materials a TAL is preferably used with a $T_g$ value between 20° C. and 45° C., a melt viscosity greater than 7000 Poise and an elasticity corresponding to a $(tg\ \delta)^{-1}$ value greater than 1.30 measured at 120° C. with a VISCOELASTIC MELT TESTER of Rheometrics Co, Surrey, UK. The $(tg\ \delta)^{-1}$ value is a measure for the elasticity as described in "Polymer Chemistry: the Basic Concept" by P. C. Hiemenz, 1984, edit. by M. Dekker Inc., New York.

For ecological and practical reasons the TAL is preferably coated from an aqueous medium. Therefore the polymers are preferably incorporated as latices.

Preferred latices are latices of styrene, styrene-butadiene, styrene-(meth)acrylate and n.butylacrylate-methylmethacrylateacrylonitrile. These latices can contain other comonomers which improve the stablitity of the latex, such as acrylic acid, methacrylic acid and acrylamide. Other possible latices include polyvinylacetate, polyethylene-vinylacetate, polyacrylonitrile-butadiene-acrylic acid, polymethylmethacrylate-butylmethacrylate, polymethylmethacrylate-ethylacrylate, polystyrene-butylacrylate, polymethylmethacrylate-butadiene, polyester of terephtalic acid-sulphoisophtalic acid-ethyleneglycol, copolyester of terephtalic acid-sulphoisophtalic acid-hexanediol-ethyleneglycol.

Particularly suitable polymers for use in the TAL layer are the BAYSTAL polymer types, marketed by Bayer AG, Germany, which are on the basis of styrene-butadiene copolymers with a weight ratio between 40/60 and 80/20. If desired a few weight % (up to about 10%) of acrylamide and/or acrylic acid can be included. Other useful polymers are the EUDERM polymers, also from Bayer AG, which are copolymers comprising n.-butylacrylate, methylmethacrylate, acrylonitrile and small amounts of methacrylic acid.

Various additives can be present in the TAL to improve the layer formation or the layer properties, e.g. thickening agents, surfactants, levelling agents, thermal solvents and pigments.

Apart from the thermo-adhesive layer to which the receptor layer will be laminated and which must comply with the requirements described above the material can contain one or more supplementary thermo-adhesive layer(s) positioned between the upper TAL and the hydrophobic photosensitive composition e.g. to optimize the adherance to the hydrophobic photosensitive composition in view of obtaining a better image quality after the delamination process. This (these) other TAL(s) can have a composition and/or physical properties different from those imposed to the upper TAL. This (these) layer(s) can contain one polymer or a mixture of polymers, optionally in combination with low-molecular additives like plasticizers or thermosolvents. Other ingredients which can be incorporated include waxes, fillers, polymer beads, glass beads, silica etc.

Suitable pressure-adhesive layers (PALs) for use in the present invention comprise one or more pressure sensitive adhesives. Said pressure sensitive adhesives are preferably tacky elastomers e.g. block copolymers of styrene/isoprene, styrene/butadiene rubbers, butyl rubbers, polymers of isobutylene and silicones. Particularly preferred are natural rubbers and acrylate copolymers as disclosed in U.S. Pat. No. 3,857,731. The used pressure sensitive adhesive preferably has a continuous-coat (100% coverage) peel adhesion value, when applied to untreated paper, between 1 and 10N/cm width, more preferably between 2 and 7N/cm width.

According to the present invention the pressure-adhesive layer comprising a pressure sensitive adhesive may contain a binder. Suitable binders for use in combination with the pressure sensitive adhesives are binders that are inert towards the pressure sensitive adhesives i.e. they do not chemically attack the pressure sensitive adhesives or act as a solvent for them. Examples of such binders are nitrocellulose, urethanes, gelatin, polyvinyl alcohol etc.

The amount of binder should be chosen such that the pressure sensitive adhesives are effectively anchored to the hydrophobic photosensitive composition. Preferably the amount of binder is lower than 2.5 parts by weight with respect to the pressure sensitive adhesives and more preferably lower than 0.6.

According to the present invention the pressure-adhesive layer comprising a pressure sensitive adhesive may also contain a tackyfier e.g. rosin soap or a terpene.

According to the present invention the imaging element containing a pressure-adhesive layer comprises preferably also a receptor element on top of said pressure-adhesive layer. In general said receptor element is (are) (a) transparent layer(s) contiguous to said pressure-adhesive layer e.g. a transparent organic resin layer.

The thickness of the transfer layer is important for the adherence during the lamination/delamination process. Preferably the thickness of said transfer layer lies between 0.1 and 30 µm, more preferably between 0.1 and 15 µm.

The imaging element can also comprise on top of the transfer layer(s) as further protective layer a receptor layer which is capable of adhering to the underlying contiguous layer. Said receptor layer is preferably stable at the processing conditions. The particular layer used is dependant on the nature of the composition of the imaging element. Suitable receptor layers include paper; cardboard; metal sheets; foils and meshes e.g. aluminum, copper, steel, bronze etc.; transparent organic resins e.g. cellulose esters such as cellulose acetate, cellulose propionate and cellulose butyrate, polyvinyl acetals, polystyrene, polycarbonate or polyvinylchloride; opaque foamed or pigmented polyester; silk; cotton and viscose rayon fabrics or screens. Preferred receptor layers are commercially available paper brands as disclosed in PCT/EP 94/02063, which therefor is incorporated herein by reference and films of polyesters such as polyethylene terephthalate or of poly-Alpha-olefins such as polyethylene or polypropylene.

A receptor element according to the invention comprises at least a receptor layer. Said receptor element may further comprises a thin additional layer. Examples of such receptor elements are supports provided with a thin metal layer e.g. polyester supports provided with a vapour deposited metal layer and most useful polyethylene coated paper. A receptor element may also comprise (a) additional layer(s) such as (a) backing layer(s).

The support of the imaging element according to the present invention has a hydrophilic surface and should be stable at the processing conditions.

Said support with a hydrophilic surface may be a hydrophilic metallic support e.g. a grained and anodized aluminum support.

More preferably, said support with a hydrophilic surface comprises a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199.

A particularly suitable hydrophilic layer is a layer of polyvinyl alcohol hardened with tetramethylorthosilicate or tetraethylorthosilicate containing $TiO_2$, wherein the weight ratio between said polyvinylalcohol and said tetramethylorthosilicate or tetraethylorthosilicate is between 0.8 and 2 and wherein the weight ratio between said polyvinylalcohol and said titaniumdioxide is preferably not higher than 1.

The above mentioned flexible supports may be opaque or transparent, e.g. a paper support or resin support. When a paper support is used preference is given to one coated at one or both sides with an Alpha-olefin polymer, e.g. a polyethylene layer which optionally contains an antihalation dye or pigment. It is also possible to use an organic resin support e.g. cellulose esters such as cellulose acetate, cellulose propionate and cellulose butyrate; polyesters such as poly(ethylene terephthalate); polyvinyl acetals, polystyrene, polycarbonates; polyvinylchloride or poly-Alpha-olefins such as polyethylene or polypropylene.

One or more subbing layers may be coated between the flexible hydrophobic support and the hydrophilic layer for use in accordance with the present invention in order to get an improved adhesion between these two layers.

A preferred subbing layer for use in connection with the present invention, is a subbing layer which is contiguous to the hydrophilic layer and contains gelatin and silica.

According to the present invention the imaging element comprises on the hydrophilic surface of the support and contiguous thereto a hydrophobic photosensitive composition comprising a photosensitive acid precursor, an acid-sensitive composition which is capable of undergoing polymerization or cross-linking and a hydrophobic binder.

Said hydrophobic photosensitive composition can be a homogeneous layer, a heterogeneous layer or even two contiguous layers.

Suitable photosensitive acid precursors for use in connection with the present invention include o-quinone diazides; diazonium salts as described in *Photogr. Sci. Eng.* by S. I. Schlesinger, 18, 387 (1974); ammonium salts as described in U.S. Pat. No. 4,069,055; phosphonium salts as described in *Macromolecules*, by D. C. Necker et al, 17, 2468 (1984); iodonium salts as described in *Macromolecules*, by J. V. Crivello et al, 10 (6), 1307 (1977); sulfonium salts as described in *Polymer J.*, by J. V. Crivello et al, 17, 73 (1985); selenonium salts as described in *Macromolecules*, by J. V. Crivello et al, 10 (6), 1307 (1977); arsonium salts as described in *Teh. Proc. Conf. Rad. Curing ASIA*, by C. S. Wen et al, pp. 478, Tokyo (October 1988); organic halogenated compounds as described in U.S. Pat. No. 3,905,815; organic metal/organic halogenated compounds as described in *J. Rad. Curing*, by K. Meier et al, 13 (6), 26 (1986); photo acid generating agents having an o-nitrobenzyl type protective group as described in *Polymer Sci.*, by S. Hayase et al, 25, 573 (1987); the compounds which are subjected to a photodecomposition to generate a sulfonic acid, represented by iminosulfonate as described in *Polymer Preprints* Japan, by M. Tunooka et al, 35 (8), by disulfon compounds described in JP-Pi 61-166544, by α-sulphonyloxy ketones, by α-hydroxymethylbenzoine sulphonates, by nitrobenzyl sulphonates, by aryl diazidonaphthoquinone-4-sulphonate, by α-sulphonyl acetophenones and by sulphonyl imides, the preparation of these last compounds being well known in the literature; the compounds which are subjected to a photodecomposition to generate a phosphonic acid, a partly esterified phosphoric acid or phosphoric acid, represented by nitrobenzylphosphates or phosphonates as described in *Tetrahedron Letters*, by M. Rubinstein et al., 17, 1445 (1975), by benzoine phosphates or phosphonates, as described in *J. Org. Chem.* by M. Pirrung and S. Shuey, 59, 3890 (1994), by pyrenemethylphosphates or phosphonates, by iminophosphates or phosphonates and by imidophosphates or phosphonates, the preparation of these last compounds being well known in the literature.

Further, compounds in which the above photosensitive acid precursors are introduced into a primary chain or a side chain of a polymer can be used. Examples thereof include the compounds described in e.g. *J. Am. Chem. Soc.*, by M. E. Woodhouse et al, 104, 5586 (1982); *J. Imaging Sci.*, by S. P. Pappas et al. 30 (5), 218 (1986); etc.

Preferably, the photosensitive acid precursors used in connection with the present invention are non-ionic compounds which by photodecomposition generate a sulfonic acid, a phosphonic acid, phosphoric acid or a partly esterified phosphoric acid, more preferably nitrobenzyl sulphonates, phosphonates or phosphates, most preferably 2,6-dinitrobenzyl sulphonates, phosphonates or phosphates.

The weight ratio of the photosensitive acid precursor to the polymeric binder in said layer preferably ranges from 0.5% to 40%, more preferably from 3% to 20%.

The acid-sensitive composition can comprise a monomer capable of undergoing cationic polymerization which are well known to one skilled in the art. In another embodiment said acid-sensitive composition comprises a compound with at least two hydroxyl groups and a reagent which is capable of crosslinking under the influence of an acid said compound with at least two hydroxyl groups. In a third embodiment said acid-sensitive composition comprises a compound comprising at least two latent or masked electrophilic groups that are transformed into electrophilic groups upon reaction with acid and a compound containing an aromatic moiety that is susceptible to electrophilic aromatic substitution.

Monomers capable undergoing cationic polymerization are preferably compounds comprising at least one vinylether, propenylether or epoxy function. More preferably said compounds comprises at least two of said functions. Most preferably polyfunctional epoxy compounds are used based e.g. on the reaction product of Bisphenol A, that is 2,2-bis(4-hydroxyphenyl)propane and epichlorohydrin, for example the resins sold under the registered trademark DER by Dow Chemicals. Preferably said monomers are used in an amount ranging from 0.1 to 70% by weight of the hydrophobic photosensitive composition, more preferably in an amount ranging from 1 to 20% by weight.

Compounds comprising at least two hydroxyl groups can be low molecular compounds but may also be polymers. Preferably said compounds are used in an amount ranging from 0.1 to 70% by weight of the hydrophobic photosensitive composition, more preferably in an amount ranging from 1 to 20% by weight.

Reagents which are capable of crosslinking under the influence of an acid said compounds with at least two hydroxyl groups are f.i. compounds comprising at least two isocyanate groups, for example the compounds sold under the registered trade name DESMODUR by Bayer, tetraalkoxymethyl glycolurils, for example the compound sold under the registered trade name CYMEL 1170 by Dyno Cyanamid and compounds represented by the following formula

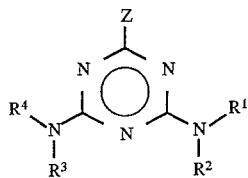

wherein Z represents —NRR' or a phenyl group, R, R' and $R^1$ to $R^4$ each independently represents a hydrogen atom, $CH_2OH$ or $CH_2OR^5$ in which $R^5$ represents an alkyl group.

Preferably said crosslinking reagents are used in an amount ranging from 0.1 to 70% by weight of the hydrophobic photosensitive composition, more preferably in an amount ranging from 1 to 20% by weight.

Compounds comprising at least two latent or masked electrophilic groups may be aliphatic compounds comprising at least two hydroxyl functions or compounds comprising an aromatic ring substituted with at least two latent or masked electrophilic groups or compounds comprising at least two aromatic rings comprising at least one latent or masked electrophilic group. The latent or masked electrophilic group is preferably —$CH^2OR^6$, wherein $R^6$ represents a hydrogen atom or an acyl rest. Also preferably said aromatic rings are substituted phenols.

Preferably said compounds comprising at least two latent or masked electrophilic groups are used in an amount ranging from 0.1 to 70% by weight of the hydrophobic photosensitive composition, more preferably in an amount ranging from 1 to 20% by weight.

Compounds containing an aromatic moiety that are susceptible to electrophilic aromatic substitution may be low molecular weight compounds but are preferably polymers, more preferably polymers containing a phenolic moiety, most preferably polyvinyl 4-hydroxystyreen or novolac resins.

Preferably said compounds containing a phenolic moiety that are susceptible to electrophilic aromatic substitution are used in an amount ranging from 0.1 to 70% by weight of the hydrophobic layer, more preferably in an amount ranging from 1 to 20% by weight.

Suitable hydrophobic binders for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymers;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Polyacrylate and alpha-alkyl polyacrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alkohol;

(M) Polyvinyl acetals, e.g. polyvinyl butyral, polyvinyl formal;

(N) Polyformaldehydes;

(O) Polyurethanes and copolymers;

(P) Polycarbonates and copolymers;

(Q) Polystyrene and copolymers e.g. polystyrene/acrylonitrile, polystyrene/acrylonitrile/butadiene.

Preferably, the hydrophobic binders used in connection with the present invention are copolymers of styrene, more preferably copolymers of styrene and (meth)acrylates, most preferably copolymers of styrene and butyl methacrylate.

The hydrophobic photosensitive composition used in accordance with the present invention is preferably coated in a range from 0.30 g/m² to 5.00 g/m², more preferably in a range from 1.00 g/m² to 3.50 g/m².

In general, the hydrophobic photosensitive composition used in accordance with the present invention also comprises at least one spectral sensitizer in order to sensitize said hydrophobic photosensitive composition to a wavelength region longer than far ultraviolet in which a photosensitive acid precursor used has no absorption.

Preferred spectral sensitizers include benzophenone, p,p'-tetraethylmethyldiaminobenzophenone, p,p'-tetraethylethylaminobenzophenone, thio-xanthone, 2-chlorothioxanthone, anthrone, 9-ethoxyanthracene, anthracene, pyrene, perylene, phenothiazine, benzil, acridine orange, benzoflavone, Setoflavin-T, 9,10-diphenylanthracene, 9-fluorenone, acetophenone, phenanthrene, 2-nitrofluorene, 5-nitroacenaphthene, benzoquinone, 2-chloro-4-nitro-aniline, N-acyl-p-nitroaniline, p-nitroaniline, N-acyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis-(5, 7-dimethoxycarbonylcoumarin) and coronene.

To the hydrophobic photosensitive composition there can also be added non-thermoplastic polymeric compounds to give certain desirable characteristics, e.g. to improve adhesion to said hydrophilic surface of the support used in accordance with the present invention, wear properties, chemical inertness, etc. Suitable non-thermoplastic polymeric compounds include cellulose, phenolic resins, melamine-formaldehyde resins, etc. If desired, the hydrophobic photosensitive composition can also contain immiscible polymeric or non-polymeric organic or inorganic fillers or reinforcing agents which are essentially transparent at the wave-lengths used for the exposure of the imaging element, e.g. organophilic silicas, bentonites, silica, powdered glass, colloidal carbon, as well as various types of dyes and pigments in amounts varying with the desired properties of the hydrophobic photosensitive composition. The fillers are useful in improving the strength of the composition, reducing tack and in addition, as coloring agents.

Agents to improve the wetting and/or adjust the adhesion of the hydrophobic photosensitive composition may be added. Suitable agents are e.g. silicons, silicon containing polymers e.g. a poly(dimethylsiloxane)-polyether copolymer, poly(dimethylsiloxane)-polyester, silicon containing surfactants, fluor containing copolymers and fluor containing surfactants etc.

Various dyes, pigments, thermographic compounds, UV-absorbers, anti-oxidants and color forming components as disclosed in EP-A 522,616 can be added to the hydrophobic photosensitive composition to give a variety of images after the processing. These additive materials should however preferably not absorb excessive amounts of light at the exposure wavelength or inhibit the acid generating reaction.

The imaging element may be prepared by coating the layers on each other or by laminating layers or packets of layers to each other.

In a practical embodiment the imaging element is prepared by the following steps:

coating on the hydrophilic surface of the support in accordance with the present invention (i) a hydrophobic photosensitive composition comprising a photosensitive acid precursor, an acid-sensitive composition which is capable of undergoing polymerization or cross-linking and a hydrophobic binder and (ii) a thermo-adhesive layer with optionally an underlying pressure-adhesive layer.

In another practical embodiment the imaging element is prepared by laminating the above described imaging element with its thermo-adhesive layer onto a receptor layer or onto a pressure-adhesive layer coated on a receptor layer.

In still another practical embodiment the imaging element is prepared by the following steps:

coating on the hydrophilic surface of a support in accordance with the present invention a hydrophobic photosensitive composition comprising a photosensitive acid precursor, an acid-sensitive composition which is capable of undergoing polymerization or cross-linking and a hydrophobic binder and laminating the above described imaging element with its hydrophobic photosensitive composition onto a pressure-adhesive or thermo-adhesive layer coated on a receptor layer.

According to the method of the present invention for obtaining an image an imaging element according to the present invention is image-wise or information-wise exposed to actinic radiation to harden the photopolymerizable composition pattern-wise. The exposure can be a contact exposure using e.g. ultraviolet radiation, a camera exposure, a scanning exposure, or a laser exposure. The radiation source used in carrying out the exposure step includes e.g. sunlight, incandescent lamps, mercury vapour lamps, halogen lamps, xenon lamps, fluorescent lamps, light-emitting diodes, lasers, electron rays, and X-rays.

Said exposure can be made through the front side or the back side of the imaging element. It goes without saying that for an exposure through the back the support has to be transparent for the radiation used for the exposure of the imaging element where for a front side exposure any protective layer has to be transparent for said radiation. Preferably the imaging element is exposed through the front side.

The imaging element according to the present invention is a negative working imaging element. Indeed the information-wise exposure to actinic radiation hardens the hydrophobic photosensitive composition pattern-wise in correspondence to the information-wise distribution of actinic radiation. Subsequent to the information-wise exposure the image is obtained by (i) laminating said imaging element with its upper non-receptor layer to a receptor layer before or after said exposure and (ii) peeling away the receptor element, comprising said receptor layer from the hydrophilic surface of the support, thereby transferring the non-hardened or insufficiently hardened parts of the hydrophobic photosensitive composition and the overlying layer (s) to the receptor element and uncovering the image comprised of the hydrophilic surface of the support and the retained hardened parts of the hydrophobic photosensitive composition.

When the imaging element does not comprise a pressure-adhesive layer said laminating is effected by means of a heating step, preferably at a temperature between 40° C. and 180° C., more preferably at a temperature between 65° C. and 120° C. Said heating may be applied to either or both the imaging element and the receptor element before, while or after bringing the receptor layer in contact with the upper non-receptor layer of the imaging element.

When the imaging element comprises a pressure-adhesive layer, said laminating requires a pressure step. Said pressure is applied while the receptor layer is in contact with the upper non-receptor layer of the imaging element.

An imaging element and a receptor element may be brought in contact before exposure. In such embodiment it is required that either the back of the imaging element and/or preferably the receptor element is transparant for the radiation used for the exposure of the photopolymerizable composition.

Because the imaging element according to the present invention comprises a hydrophobic photosensitive composition contiguous to a hydrophilic surface of a support, the obtained image can be used as a lithographic printing plate. Pattern-wise transfer of the hydrophobic photosensitive composition to a receptor material will then result in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink. The areas which accept ink form the printing image areas and the ink-rejecting areas form the background areas.

Said lithographic printing plate can further be cleaned with water or an aqueous solution e.g. by wipping with a wet sponge, rinsing with a spray of unheated water or of an aqueous solution etc.

The following examples illustrate the present invention without limiting it thereto.

EXAMPLE 1 (Example according to the invention)

Preparation of the Hydrophilic Surface of the Support

To 440 g of a dispersion contg. 21.5% of $TiO_2$ (average particle size 0.3–0.5 μm) and 2.5% of polyvinylalcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethylene terephthalate film support having a thickness of 175 μm (having provided thereon a hydrophilic subbing layer) at a wet coating thickness of 50 g/m2, dried at 30° C. and subsequently hardened by subjecting it to a temperature of 57° C. for 1 week.

Preparation of the Imaging Element

Onto the above obtained hydrophilic surface of the support was coated a photosensitive composition consisting of a solution in methylethylketone of 7.85% by weight of a copolymer styrene/butylmethacrylate (Toner Resin OT 5154 from Degussa AG), 0.15% by weight of a blue dye (C.I. 61551), 0.5% by weight of bis[4-(diphenylsulphonio)-phenyl]sulphide bis-hexafluorophosphate (Degacure K I85 from Degussa AG), 0.5% by weight of thioxanthone (Aldrich Belgium) and 1.0% by weight of an epoxy resin (DER 331 from Dow Chemical) at a wet coating thickness of 37.5 um.

The above obtained imaging element was overcoated with a solution consisting of 20% by weight aqueous dispersion of Baystal P2000 (from Bayer AG, Germany) which is a copolymer containing styrene, butadiene and acrylic acid with a glass transition temperature of 34° C. (measured with the "1090 Thermolyzer" of Dupont Co.), a melt viscosity of more than 13420 Poise and an elasticity corresponding to a $(tg\ \delta)^{-1}$ value of 3.54, both last properties measured at 120° C. (with the "viscoelastic melt tester" of Rheometrics Co., UK), to a wet coating thickness of 30 g/m$^2$.

Preparation and Evaluation of the Lithographic Plate

On top of this imaging element and of those described below was placed a test target with a 60 lines per cm screen as well as fine positie and negative lines, and the imaging element was exposed therethrough to ultraviolet radiation.

Each of the exposed imaging elements was then placed in face-to-face contact with the receptor element, being a subbed polyethyleneterephtalate support (having an upper subbing layer containing gelatin and silica).

The contacting elements were conveyed through a roll laminator device at 90° C. and at a speed of 0.3 m/min. and the elements were peeled apart wereby the non-exposed parts of the hydrophobic photosensitive composition are removed and the exposed areas remain on the hydrophilic surface of the support, thus being a negative working system.

A good image was obtained with a line reproduction for lines of 12 μm.

The obtained image on the hydrophilic surface of the support could be used to print on a conventional offset press using a commonly employed ink and fountain. Good copies were obtained with this sample.

EXAMPLE 2 (Example according to the invention)

An imaging element was prepared, exposed, laminated and peeled apart similar to the imaging element of example 1 except that the hydrophobic photosensitive composition was coated onto the hydrophilic surface of the support from a solution in methylethylketone of 7.85% by weight of a copolymer styrene/butylmethacrylate (Toner Resin OT 5154 from Degussa AG), 0.15% by weight of a blue dye (C.I. 61551), 0.5% by weight of 2-nitrobenzyl-tosylate, 0.5% by weight of thioxanthone (Aldrich Belgium) and 0.4% by weight of di-trimethylolpropane (Perstorp AB) and 0.6% by weight of a melamine resin (CYMEL 301 from Dyno Cyanamid) at a wet coating thickness of 37.5 um.

After the peeling apart, the non-exposed parts of the hydrophobic photosensitive composition are removed and the exposed areas remain on the hydrophilic surface of the support, thus being a negative working system.

A good image was obtained with a line reproduction for lines of 12 μm.

The obtained image on the hydrophilic surface of the support could be used to print on a conventional offset press using a commonly employed ink and fountain. Good copies were obtained with this sample.

EXAMPLE 3 (Example according to the invention)

An imaging element was prepared, exposed, laminated and peeled apart similar to the imaging element of example 1 except that the hydrophobic photosensitive composition was coated onto the hydrophilic surface of the support from a solution in methylethylketone of 7.85% by weight of a copolymer styrene/butylmethacrylate (Toner Resin OT 5154 from Degussa AG), 0.15% by weight of a blue dye (C.I. 61551), 0.5% by weight of an iron arene comples (Irgacure 261 from Ciba Geigy AG), 0.5% by weight of thioxanthone (Aldrich Belgium) and 0.5% by weight of di-trimethylolpropane (Perstorp AB) and 0.5% by weight of 1,6-hexamethylenediisocyanate (Desmodur N75 from Bayer AG) at a wet coating thickness of 37.5 um.

After the peeling, the non-exposed parts of the hydrophobic photosensitive composition are removed and the exposed areas remain on the hydrophilic surface of the support, thus being a negative working system.

A good image was obtained with a line reproduction for lines of 12 μm.

The obtained image on the hydrophilic base could be used to print on a conventional offset press using a commonly employed ink and fountain. Good copies were obtained with this sample.

EXAMPLE 4 (Example according to the invention)

An imaging element was prepared, exposed, laminated and peeled apart similar to the imaging element of example 1 except that the hydrophobic photosensitive composition was coated onto the hydrophilic surface of the support from a solution in methylethylketone of 8.35% by weight of a copolymer styrene/butylmethacrylate (Toner Resin OT 5154 from Degussa AG), 0.15% by weight of a blue dye (C.I. 61551), 0.5% by weight of 2-nitrobenzyl-tosylate, 0.5% by weight of thioxanthone (Aldrich Belgium) and 0.5% by weight of di-trimethylolpropane (Perstorp AB) at a wet coating thickness of 37.5 um.

After the peeling, the non-exposed parts of the hydrophobic photosensitive composition are removed and the exposed areas remain on the hydrophilic surface of the support, thus being a negative working system.

A good image was obtained with a line reproduction for lines of 12 μm.

The obtained image on the hydrophilic surface of the support could be used to print on a conventional offset press using a commonly employed ink and fountain. Good copies were obtained with this sample.

We claim:

1. An imaging element comprising contiguous to a hydrophilic surface of a support a hydrophobic photosensitive composition comprising a photosensitive acid precursor, an acid-sensitive composition which is capable of undergoing polymerization or cross-linking and a hydrophobic binder characterized in that said imaging element comprises one or more protective layers, at least one of the protective layers being contiguous to the hydrophobic photosensitive composition and being a transfer layer which is capable of adhering to a receptor element.

2. An imaging element according to claim 1 wherein at least one protective layer is a thermo-adhesive layer having a glass transition temperature $T_g$ between 10° C. and 100° C., measured with a THERMOANALYZER of Du Pont Co.

3. An imaging element according to claim 1 wherein at least one protective layer is a pressure-adhesive layer with a continuous-coat (100% coverage) peel adhesion value, when applied to untreated paper between 1 and 10N/cm width.

4. An imaging element according to claim 1 wherein said acid-sensitive composition comprises a non-ionic photosensitive acid precursor which by photodecomposition generates a sulphonic acid.

5. An imaging element according to claim 1 wherein said acid-sensitive composition comprises a non-ionic photosensitive acid precursor which by photodecomposition generates a phosphonic acid, phosphoric acid or a partially esterified phosphoric acid.

6. An imaging element according to claim 1 wherein said acid-sensitive composition comprises a monomer capable of undergoing a cationic polymerization.

7. An imaging element according to claim 6 wherein said monomer comprises at least one vinylether, propenylether or epoxy function.

8. An imaging element according to claim 1 wherein said acid-sensitive composition comprises a compound with at least two hydroxyl groups and a reagent which is capable of crosslinking under the influence of an acid said compound with at least two hydroxyl groups.

9. An imaging element according to claim 8 wherein said reagent which is capable of crosslinking under the influence of an acid said compound with at least two hydroxyl groups is a di- or polyisocyanate or a compound represented by the following formula:

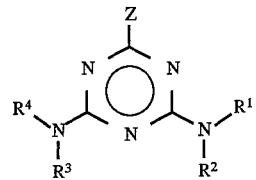

wherein Z represents —NRR' or a phenyl group, R, R' and $R^1$ to $R^4$ each independently represents a hydrogen atom, $CH_2OH$ or $CH_2OR^5$ in which $R^5$ represents an alkyl group.

10. An imaging element according to claim 1 wherein said acid-sensitive composition comprises a compound comprising at least two latent or masked electrophilic groups that are transformed into electrophilic groups upon reaction with acid and a compound containing an aromatic moiety that is susceptible to electrophilic aromatic substitution.

11. A method for obtaining a lithographic printing plate comprising the steps of:

(a) image-wise or information-wise exposing an imaging element according to claim 1

(b) developing said exposed imaging element, characterized in that said development comprises in the order given the steps of:

(i) laminating before or after said exposure an uppermost layer of said imaging element provided said layer is not a receptor layer to a receptor layer, said receptor layer being capable of adhering to said uppermost layer and (ii) peeling away the receptor layer from the hydrophilic surface of the support thus transferring said hydrophobic photosensitive composition patternwise to the receptor layer.

* * * * *